United States Patent
Suzuki et al.

(10) Patent No.: US 6,724,216 B2
(45) Date of Patent: Apr. 20, 2004

(54) RAPID SINGLE-FLUX-QUANTUM LOGIC CIRCUIT AND RAPID SINGLE-FLUX-QUANTUM OUTPUT CONVERSION CIRCUIT

(75) Inventors: Hideo Suzuki, Yokohama (JP); Shuichi Nagasawa, Ibaraki (JP); Kazunori Miyahara, Mito (JP); Youichi Enomoto, Tokyo (JP)

(73) Assignees: Fujitsu Limited, Kawasaki (JP); NEC Corporation, Tokyo (JP); International Superconductivity Technology Center, The Juridicial Foundation, Tokyo (JP)

( * ) Notice: Subject to any disclaimer, the term of this patent is extended or adjusted under 35 U.S.C. 154(b) by 141 days.

(21) Appl. No.: 10/142,932

(22) Filed: May 13, 2002

(65) Prior Publication Data

US 2002/0169079 A1 Nov. 14, 2002

(30) Foreign Application Priority Data

May 14, 2001 (JP) ........................ 2001-143783

(51) Int. Cl.[7] ............................................. H03K 19/195
(52) U.S. Cl. ..................... 326/3; 326/4; 326/5; 326/6
(58) Field of Search ......................... 326/1–7; 327/186, 327/367, 528

(56) References Cited

U.S. PATENT DOCUMENTS 5,982,219 A * 11/1999 Kirichenko ................ 327/367
6,486,694 B1 * 11/2002 Kirichenko .................... 326/3

OTHER PUBLICATIONS

K. K. Likarev et al., *IEEE Trans. Appl. Superconductivity*, vol. 1, No. 1, Mar. 1991.

T. Hashimoto et al., pre–conference draft of 28a–G–30, 47th Applied–Physics Relation Unified Meeting, Mar. 2000.

* cited by examiner

Primary Examiner—Anh Tran
(74) Attorney, Agent, or Firm—Staas & Halsey LLP

(57) ABSTRACT

A rapid single-flux-quantum RSFQ logic circuit includes a first circuit portion having a first end grounded and having in-series connected first and second Josephson junctions. A second circuit portion has a first end grounded and has in-series connected third and fourth Josephson junctions. A first inductance element connects a second end of the first circuit portion to a second end of the second circuit portion. A tap is provided in the first inductance element, an input current signal being supplied to the tap. A bias current source is connected to a first connection node between the first and second Josephson junctions. A second inductance element connects the first connection node to a second connection node between the third and fourth Josephson junctions. A superconducting quantum interference device has fifth and sixth Josephson junctions and is coupled to the second inductance element through a magnetic field.

8 Claims, 8 Drawing Sheets

RAPID SINGLE-FLUX-QUANTUM LOGIC CIRCUIT AND RAPID SINGLE-FLUX-QUANTUM OUTPUT CONVERSION CIRCUIT

BACKGROUND OF THE INVENTION

1. Field of the Invention

The present invention generally relates to superconductivity circuits, and more particularly to a rapid single-flux-quantum (RSFQ) logic circuit which comprises Josephson junctions and inductance elements.

In the fields of information processing technology and information communication technology, including computer technology, in order to accelerate processing speed further, the logic element which can operate at high speed and by low power consumption is demanded, and a rapid single-flux-quantum logic circuit which is composed of Josephson junctions and inductance elements has been proposed as a logic element which fulfills the high speed and low power consumption demand.

2. Description of the Related Art

FIG. 1A and FIG. 1B show the equivalent circuit and the timing of operation of a RSFQ (rapid single-flux-quantum) circuit by K. K. LIKAREV ET AL., IEEE TRANS. APPL. SUPERCONDUCTIVITY, vol. 1, no. 1, March 1991, which is a conventional typical rapid single-flux-quantum logic circuit.

As shown in FIG. 1A and FIG. 1B, the incoming signals S1–Sn are supplied to the RSFQ circuit, various logic operations, such as AND, OR and NOT, are performed, and a pulse logic operation is performed, which outputs a logic output signal Sout synchronized with the timing of a clock signal T supplied to the RSFQ circuit. Since the picosecond SFQ pulse signal is used by the RSFQ circuit as an information carrier, the pulse signal shown in FIG. 1B has only the self-sustaining time on the order of picoseconds, and a conventional semiconductor circuit (e.g., an IC circuit) can hardly process the output signal of the RSFQ logic circuit.

For this reason, a direct-connection SFQ/DC voltage converter which combines a direct-current DC voltage converter with the RSFQ circuit of FIG. 1A has been proposed.

FIG. 2A and FIG. 2B show the configuration and the waveform of operation of the conventional direct-connection SFQ/DC voltage converter.

As shown in FIG. 2A, the conventional direct-connection SFQ/DC voltage converter generally includes a superconductivity circuit including Josephson junctions J1–J6 and inductance elements L1–L5. The Josephson junctions J1–J4 form an SFQ circuit, and the Josephson junctions J5 and J6 form a direct-connection DC voltage converter.

In the SFQ circuit, a first superconducting loop is provided in which the Josephson junctions J1 and J3 are connected through the inductance elements L1 and L2 and the bias current Ib1 is supplied to the connection node between the Josephson junction J1 and the inductance element L1. A second superconducting loop is provided in the SFQ circuit in which the input signal T is supplied through the inductance element L5 to the connection node between the inductance elements L3 and L4. In the second superconducting loop, the Josephson junctions J2 and J4 are connected through the inductance elements L3 and L4.

The SFQ circuit produces the output signal F, which is shown in FIG. 2B, at the connection node between the Josephson junction J3 and the Josephson junction J4. As previously described with FIG. 1B, the output signal F is the picosecond SFQ pulse signal, and a conventional semiconductor circuit can hardly process the output signal of the RSFQ logic circuit.

In the direct-connection SFQ/DC voltage conversion circuit of FIG. 2A, the direct-connection DC converter circuit is composed of the Josephson junctions J5 and J6, and the bias current Ib is supplied to the node indicated in FIG. 2A. The DC converter circuit is connected to the above SFQ circuit at the connection node between the inductance elements L1 and L2. As shown in FIG. 2B, the output voltage V of the DC converter circuit is sustained only during the period between the current pulse signal T and the following pulse signal T. This is because the SFQ is held over the period of the pulse in the superconducting loop including the Josephson junctions J1 and J3 and the inductance elements L1 and L2.

In the SFQ/DC voltage conversion circuit including the direct-connection DC converter, the DC converter is directly connected to the SFQ circuit, and the circuit design becomes troublesome. When a plurality of SFQ/DC voltage conversion circuits are connected in series in order to obtain a voltage signal on the order that can be processed by the conventional semiconductor circuit, there is a possibility that the respective SFQ circuits are influenced by the corresponding direct-connection DC converters. Usually, it is necessary that a superconducting quantum interference device (SQUID) is connected to each of the SFQ/DC voltage conversion circuits as a subsequent circuit portion. The configuration of such SFQ/DC voltage conversion circuits with the SQUIDs will increase the area of the entire circuit.

FIG. 3 shows a conventional voltage multiplier circuit which is configured by using the plurality of the direct-connection SFQ/DC conversion circuits.

In the voltage multiplier circuit of FIG. 3, the SFQ pulse signal is processed by the direct-connection SFQ/DC conversion circuits, and the output of the direct-connection SFQ/DC conversion circuits is further processed by the plurality of the SQUIDs in order to produce the voltage signal on the order that can be processed by the conventional semiconductor circuit.

As shown in FIG. 3, the input pulse signal is split into the plurality of pulse signals by the plurality of SFQ pulse splitters SP1, SP2 and SP3. The pulse signals output from the SFQ pulse splitters are respectively delivered through the transmission lines T1, T2, . . . TN. Each of these transmission lines may be formed by either a Josephson transmission line (JTL) or a JTL combined with a buffer circuit. The transmission lines T1, T2, . . . TN respectively supply the pulse signals of the individual channels CH1, CH2, . . . CHN to the direct-connection SFQ/DC conversion circuits SFQ/DC-1–SFQ/DC-N, respectively.

Furthermore, in the voltage multiplier circuit of FIG. 3, the SFQ/DC conversion circuits SFQ/DC-1–SFQ/DC-N are connected through the magnetic coupling M to the subsequent circuit portions $SQUID_1$–$SQUID_N$, respectively. The circuit portions $SQUID_1$–$SQUID_N$ are connected in series, so that the desired output voltage (NxVo) can be produced at the output of one of the circuit portions $SQUID_1$–$SQUID_N$ by the in-series connection of the $SQUID_1$–$SQUID_N$.

In the voltage multiplier circuit of FIG. 3, it is impossible to directly make the in-series connection of the direct-connection SFQ/DC voltage conversion circuits SFQ/DC-1–SFQ/DC-N. The desired output voltage (NxVo) can be obtained only by the in-series connection of the $SQUID_1$–$SQUID_N$.

SUMMARY OF THE INVENTION

An object of the present invention is to provide an improved rapid single-flux-quantum RSFQ logic circuit in which the above-described problems are eliminated.

Another object of the present invention is to provide a rapid single-flux-quantum logic circuit that promotes increasing the flexibility of circuit design.

The above-mentioned objects of the present invention are achieved by a rapid single-flux-quantum RSFQ logic circuit comprising: a first circuit portion which has a first end grounded and has a first Josephson junction and a second Josephson junction which are connected in series; a second circuit portion which has a first end grounded and has a third Josephson junction and a fourth Josephson junction which are connected in series; a first inductance element which connects a second end of the first circuit portion to a second end of the second circuit portion; a tap which is provided in the first inductance element, an input current signal being supplied to the tap; a bias current source which is connected to a first connection node between the first Josephson junction and the second Josephson junction; a second inductance element which connects the first connection node to a second connection node between the third Josephson junction and the fourth Josephson junction; and a superconducting quantum interference device which has a fifth Josephson junction and a sixth Josephson junction and is coupled to the second inductance element through a magnetic field.

In the RSFQ logic circuit of the present invention, the superconducting quantum interference device SQUID is coupled to the second inductance element through the magnetic field. It is possible that the undesired influence of the SQUID on the logic operation of the RSFQ logic circuit is significantly reduced when compared with the case of the conventional direct-connection RSFQ logic circuit. Accordingly, it is possible to provide an RSFQ output voltage converter by the in-series connection of the respective SQUIDs of the plurality of the RSFQ logic circuits.

According to the present invention, the SQUID can be internally provided within the RSFQ logic circuit, and it is not necessary to externally provide the SQUIDs when forming an output voltage conversion circuit as in the case of the conventional direct-connection RSFQ logic circuit. Hence, it is possible for the present invention to simplify the circuit configuration of the RSFQ logic circuit.

BRIEF DESCRIPTION OF THE DRAWINGS

Other objects, features and advantages of the present invention will become apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

Figure 4A:
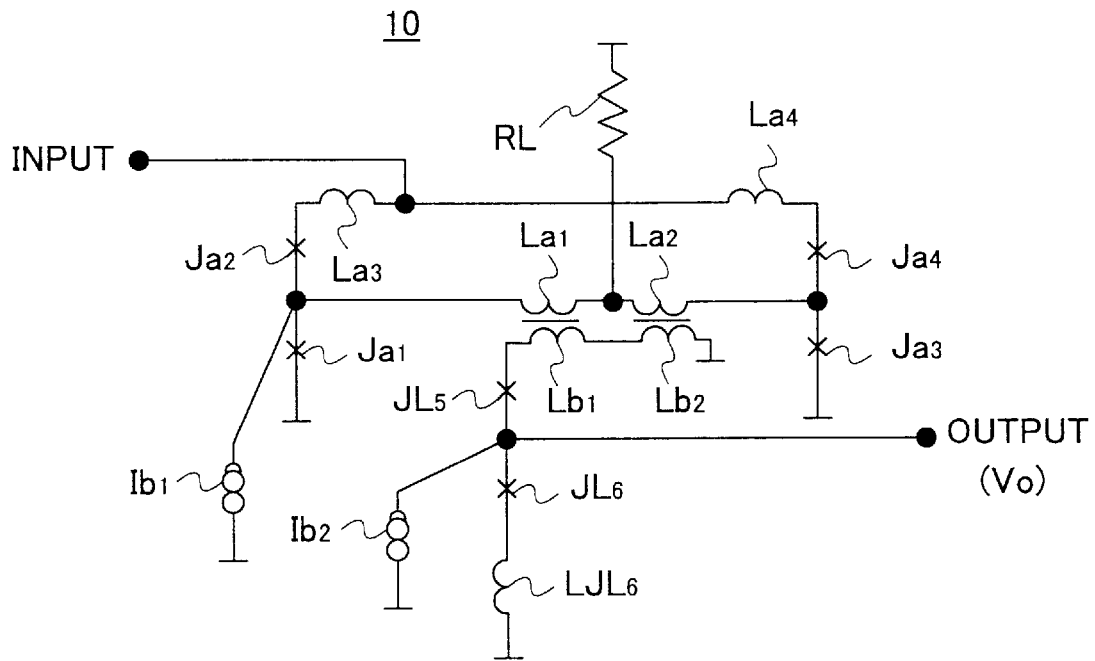
FIG. 4A is a circuit diagram of a rapid single-flux-quantum RSFQ logic circuit according to the first preferred embodiment of the present invention.

FIG. 4A shows the configuration of a rapid single-flux-quantum RSFQ logic circuit 10 according to the 1st preferred embodiment of the invention.

As shown in FIG. 4A, the RSFQ logic circuit 10 of the present embodiment includes a first circuit portion which has one end grounded and has first and second Josephson junctions Ja1 and Ja2 which are connected in series. The RSFQ logic circuit 10 includes a second circuit portion which has one end grounded and has third and fourth Josephson junctions Ja3 and Ja4 which are connected in series. The inductance elements La3 and La4, which are connected in series, connect the other end of the first circuit portion to the other end of the second circuit portion. The above structure of these elements constitutes a RSFQ logic operation portion. The input current signal is supplied to the connection node between the inductance elements La3 and La4. A tap is provided in the inductance elements La3 and La4 to receive the input current signal. The bias current, output by the bias current source Ib1, is supplied to the connection node between the Josephson junctions Ja1 and Ja2. The bias current source Ib1 has a tap that is connected to the connection node between the Josephson junctions Ja1 and Ja2.

In the embodiment of FIG. 4A, the connection node between the Josephson junctions Ja1 and Ja2 is connected to the connection node between the Josephson junctions Ja3 and Ja4 through the inductance elements La1 and La2 which are connected in series. The connection node between the inductance elements La1 and La2 is grounded through the load resistor RL.

Furthermore, in the RSFQ logic circuit 10 of FIG. 4A, the inductance elements Lb1 and Lb2 are coupled to the inductance elements La1 and La2 through a magnetic field therebetween. The inductance element Lb2 has one end grounded. The opposite end of the inductance element Lb1 is grounded through the Josephson junctions JL5 and JL6 and the inductance element LJL6 which are connected in series. The bias current, output by the bias current source Ib2, is supplied to the connection node between the Josephson junctions JL5 and JL6. The bias current source Ib2 has a tap which is connected to the connection node between the Josephson junctions Ja1 and Ja2. The Josephson junctions JL5 and JL6, the inductance elements Lb1 and Lb2, and the inductance element LJL6 constitute a SQUID (superconducting quantum interference device) that acts as the output circuit portion of the RSFQ logic circuit 10.

Figure 1A:
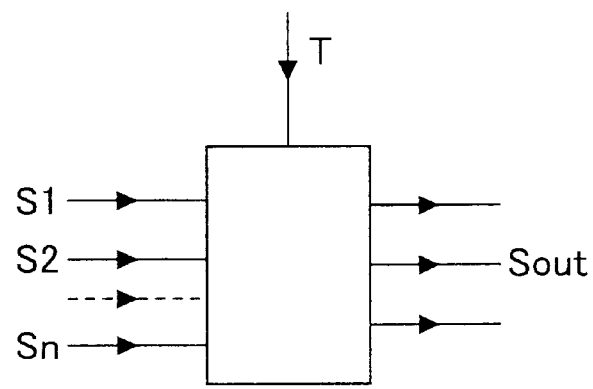
FIG. 1A is a block diagram of a conventional rapid single-flux-quantum RSFQ logic circuit acting as the T flip-flop.
Figure 1B:
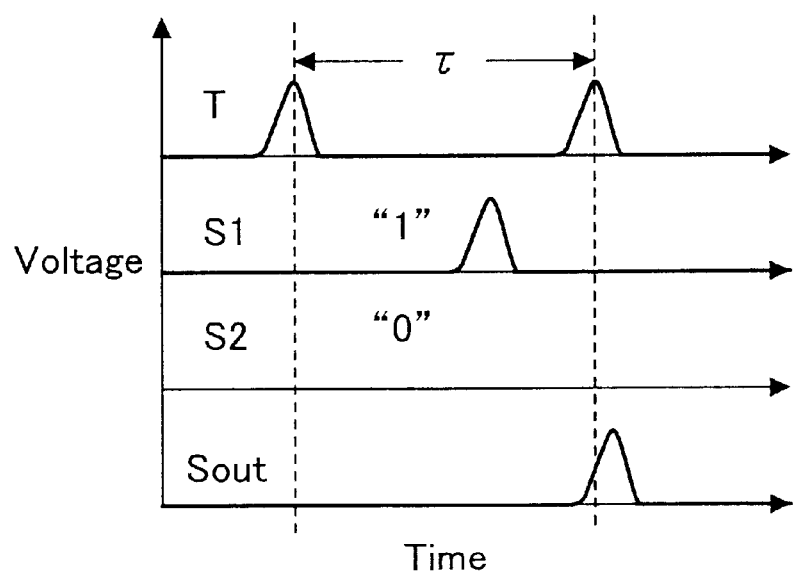
FIG. 1B is a timing chart for explaining operation of the conventional RSFQ logic circuit in FIG. 1A.
Figure 2A:
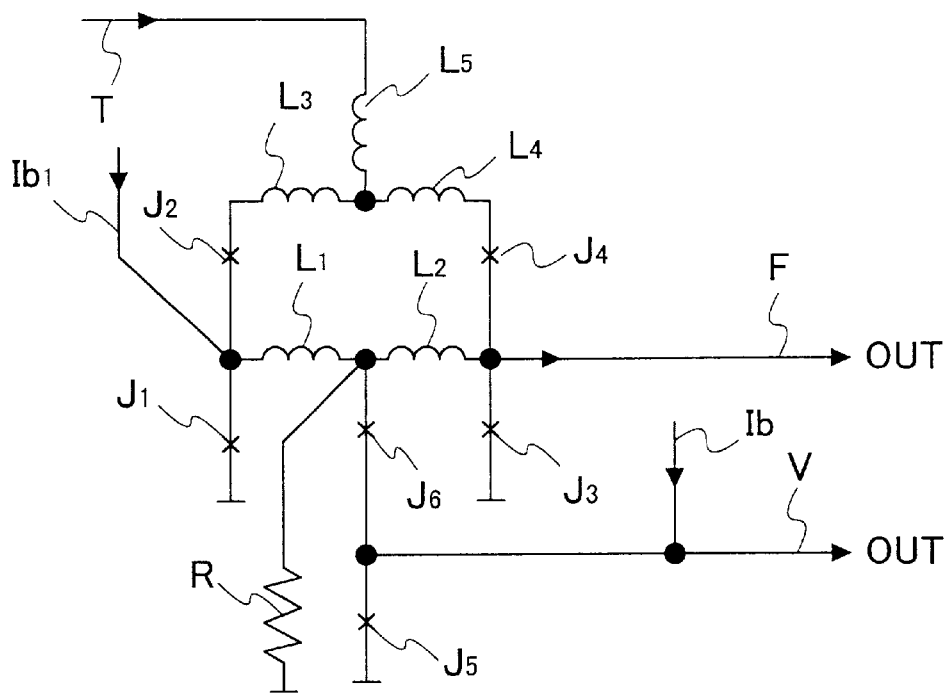
FIG. 2A is a circuit diagram of a conventional direct-connection RSFQ logic circuit.
Figure 2B:
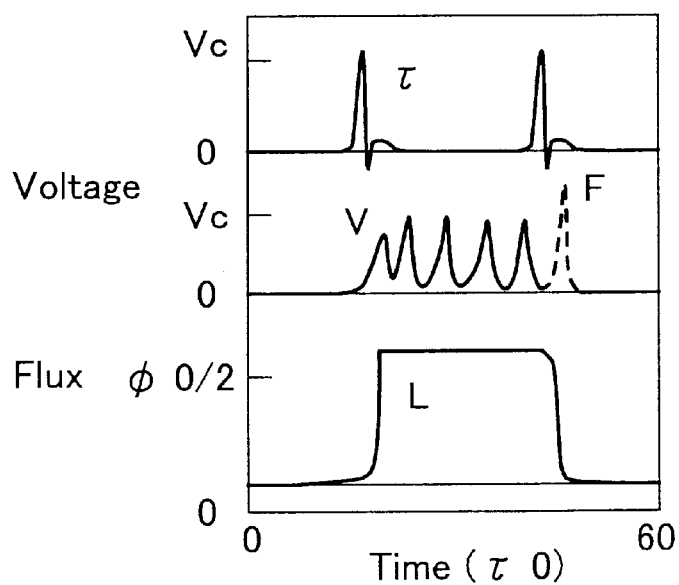
FIG. 2B is a timing chart for explaining operation of the conventional direct-connection RSFQ logic circuit in FIG. 2A.
Figure 3:
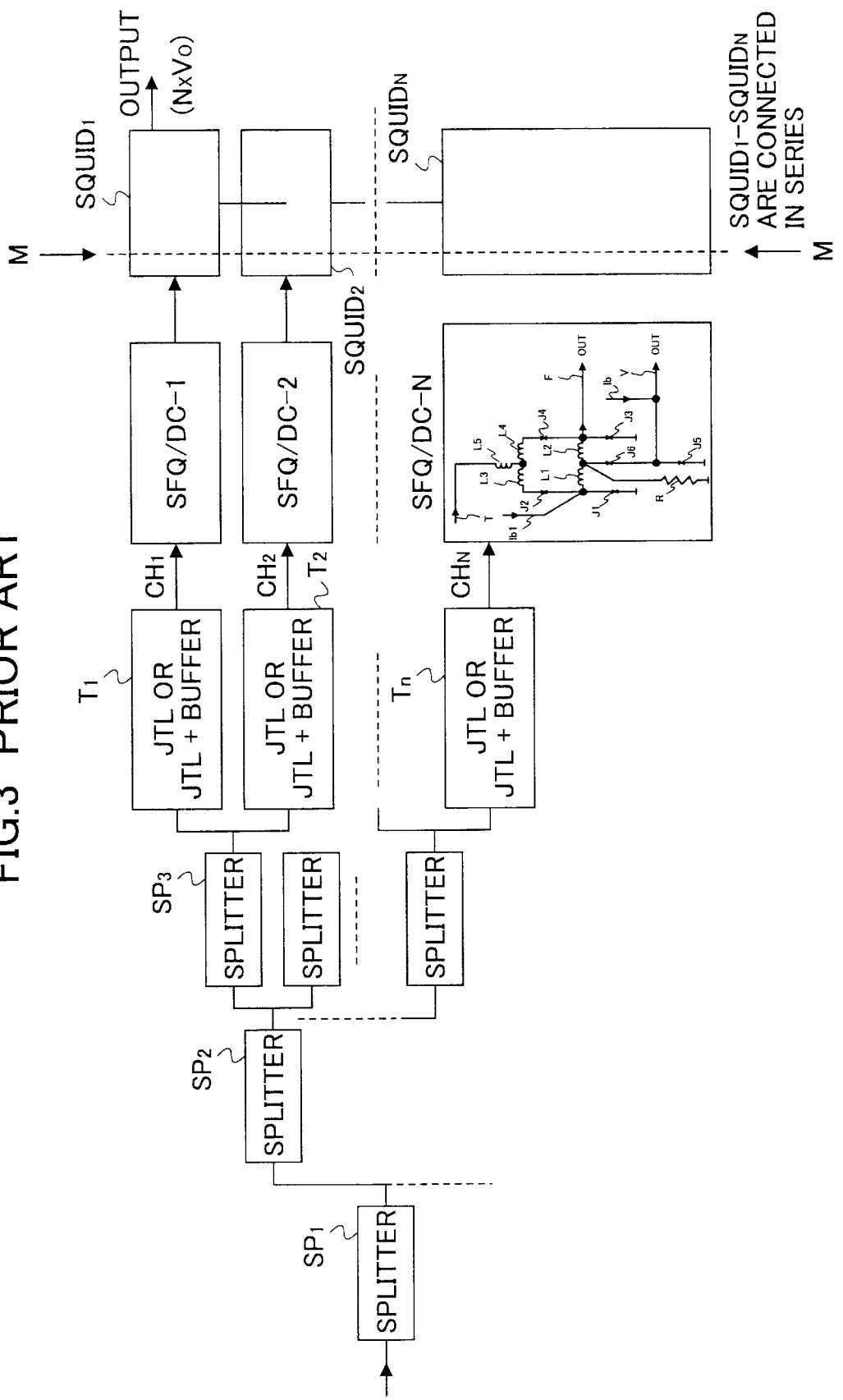
FIG. 3 is a block diagram of a conventional voltage multiplier circuit configured by using the conventional direct-connection RSFQ logic circuits.

The RSFQ logic circuit 10 of FIG. 4A performs the T flip-flop operation that is the same as that of the circuit of FIG. 2A. Namely, the picosecond output pulse F, corresponding to the input pulse T, is obtained at the connection node between the Josephson junctions Ja3 and Ja4. At the connection node between the Josephson junctions JL5 and JL6, which forms part of the SQUID, the output voltage Vo is obtained. This output vltage V corresponds to the magnetic flux quantum L accumulated in the loop which is formed by the Josephson junctions Ja1 and Ja2 and the inductance elements La1 and La2, and it is sustained only during the period between the current input pulse T and the following input pulse T.

In the embodiment of FIG. 4A, the SQUID is coupled through a magnetic field to the inductance elements Lb1 and Lb2 of the RSFQ logic operation portion. Even when the output of the SQUID is taken from the connection node between the Josephson junctions JL5 and JL6, it is possible to eliminate the problem that the operation of the RSFQ logic operation portion in the RSFQ logic circuit 10 is affected by the SQUID.

In the embodiment of FIG. 4A, each of the Josephson junctions JL5 and JL6, which form part of the SQUID output circuit, has a critical current value that is smaller than the smaller one of the critical current values of the Josephson junctions Ja1 and Ja3. For example, in the present embodiment, the Josephson junctions Ja1 and Ja3 have the critical current values 0.22 mA and 0.21 mA, respectively, while the Josephson junctions JL5 and JL6 have the critical current values 0.09 mA and 0.1 mA, respectively. In the present embodiment, the Josephson junctions JL5 and JL6 form an asymmetrical type SQUID.

Figure 4B:
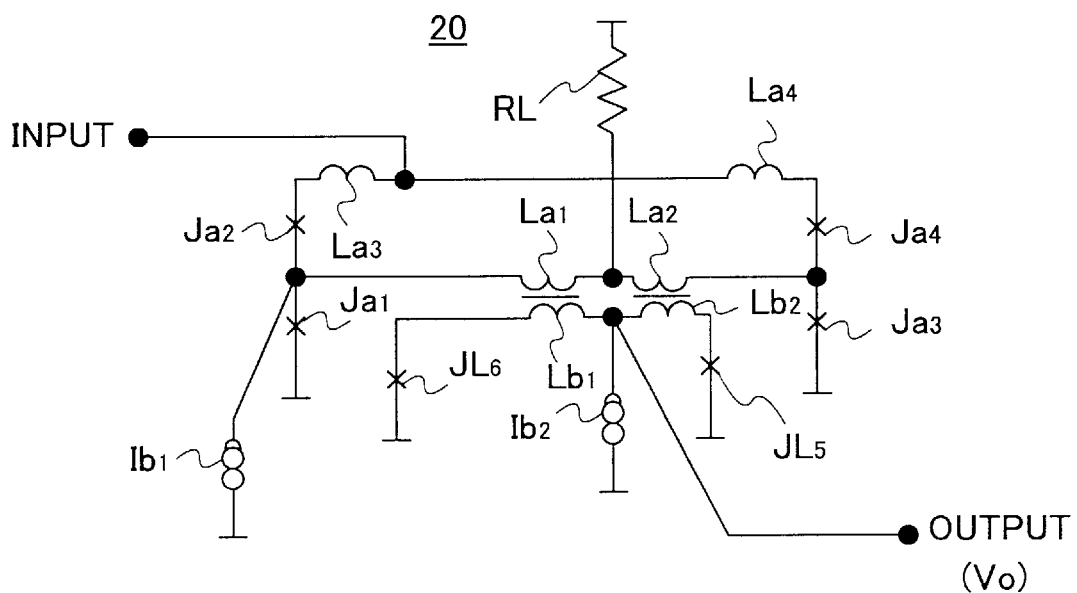
FIG. 4B is a circuit diagram of a variation of the RSFQ logic circuit of the first preferred embodiment.

FIG. 4B shows the configuration of an RSFQ logic circuit 20 as a variation of the RSFQ logic circuit 10 of FIG. 4A. In FIG. 4B, the elements that are essentially the same as corresponding elements in FIG. 4A are designated by the same reference numerals, and a description thereof will be omitted.

As shown in FIG. 4B, the RSFQ logic circuit 20 of this embodiment includes the SQUID which contains the in-series connected inductance elements Lb1 and Lb2 and is coupled through a magnetic field to the inductance elements La1 and La2, similar to the RSFQ logic circuit 10 of FIG. 4A. However, in the embodiment of FIG. 4B, the inductance elements Lb1 and Lb2 are connected to one end of the Josephson junction JL5, and the other end of the Josephson junction JL5 is grounded. Further, the inductance elements LB1 and Lb2 are connected to one end of the Josephson junction JL6, and the other end of the Josephson junction JL6 is grounded.

In the embodiment of FIG. 4B, the bias current, output by the bias current source Ib2, is supplied to the connection node between the inductance element Lb1 and the inductance element Lb2. The bias current source Ib2 has a tap that is connected to the inductance elements Lb1 and Lb2. The output voltage Vo is obtained at the connection node between the inductance element Lb1 and the inductance element Lb2.

Moreover, in the embodiment of FIG. 4B, each of the Josephson junctions JL5 and JL6, which form part of the SQUID output circuit, has a critical current value that is smaller than a smaller one of the critical current values of the Josephson junctions Ja1 and Ja3. For example, in the present embodiment, the Josephson junctions Ja1 and Ja3 have the critical current values 0.22 mA and 0.206 mA, respectively, while both the Josephson junctions JL5 and JL6 have the critical current value 0.06 mA. That is, in the present embodiment, the Josephson junctions JL5 and JL6 forms a symmetrical type SQUID.

Also, in the embodiment of FIG. 4B, the SQUID is coupled through a magnetic field to the inductance elements Lb1 and Lb2 of the RSFQ logic operation portion. Even when the output of the SQUID is taken from the connection node between the Josephson junctions JL5 and JL6, it is possible to eliminate the problem that the operation of the RSFQ logic operation portion is affected by the SQUID.

A description will be given of the second preferred embodiment of the invention.

Figure 5:
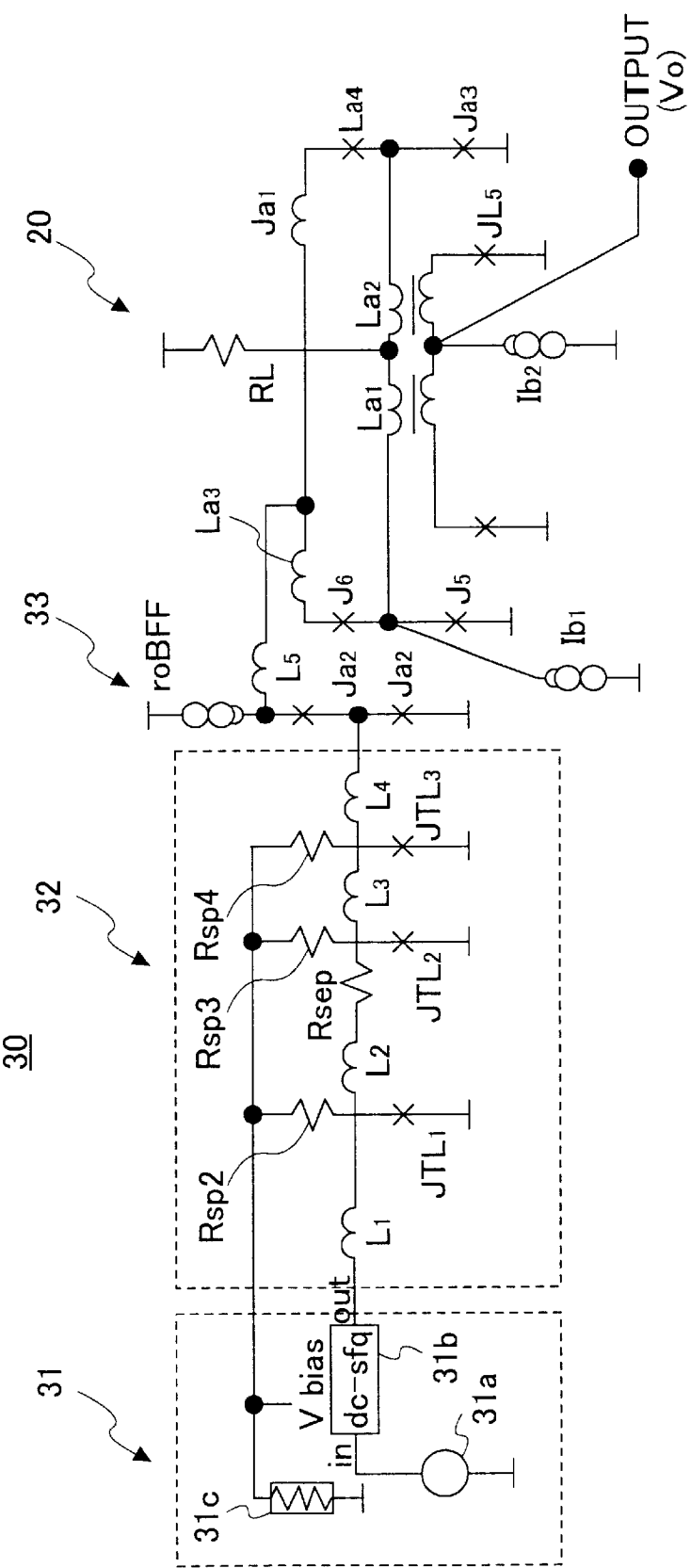
FIG. 5 is a circuit diagram of an RSFQ output voltage converter according to the second preferred embodiment of the present invention.

FIG. 5 shows the configuration of an output voltage converter 30 of the second preferred embodiment using the RSFQ logic circuit 20 of FIG. 4B. In FIG. 5, the elements that are essentially the same as corresponding elements in the previous embodiment of FIG. 4B are designated by the same reference numerals, and a description thereof will be omitted.

As shown in FIG. 5, in the output voltage converter 30 of the present embodiment, the pulse generator 31a of the pulse signal source 31 produces a pulse signal having a large pulse width. This pulse signal is processed by the single-flux-quantum (SFQ) logic generating circuit (DC/SFQ) 31b to output a SFQ pulse signal. The DC/SFQ 31b is driven by the DC bias current supplied from the bias current source 31c of the pulse signal source 31. The SFQ pulse signal output by the DC/SFQ 31b is processed by the Josephson transmission line 32, and it is further processed by the buffer circuit 32. The pulse signal output by the buffer circuit 32 is supplied to the RSFQ logic circuit 20 as the input signal.

In the embodiment of FIG. 5, the Josephson transmission line 32 includes the inductance elements L1–L4 and the resistor Rsep which are connected in series, and the inductance elements L1–L4 are shunted by the Josephson junctions JTL1–JTL3, respectively, which are connected to the resistors Rsp1–Rsp4. The buffer circuit 33 includes the Josephson junctions J5 and J6 which are connected in series, and the buffer circuit 33 is driven by the DC bias current supplied by the bias current source $Ib_{BFF}$.

In the present embodiment, the rapid single-flux-quantum logic circuit 20 is used, and it is possible that the picosecond SFQ pulse signal be converted into a pulse signal having an adequately large pulse width on the order that can be processed by the semiconductor circuit (the IC circuit).

A description will be given of the third preferred embodiment of the invention.

Figure 6:
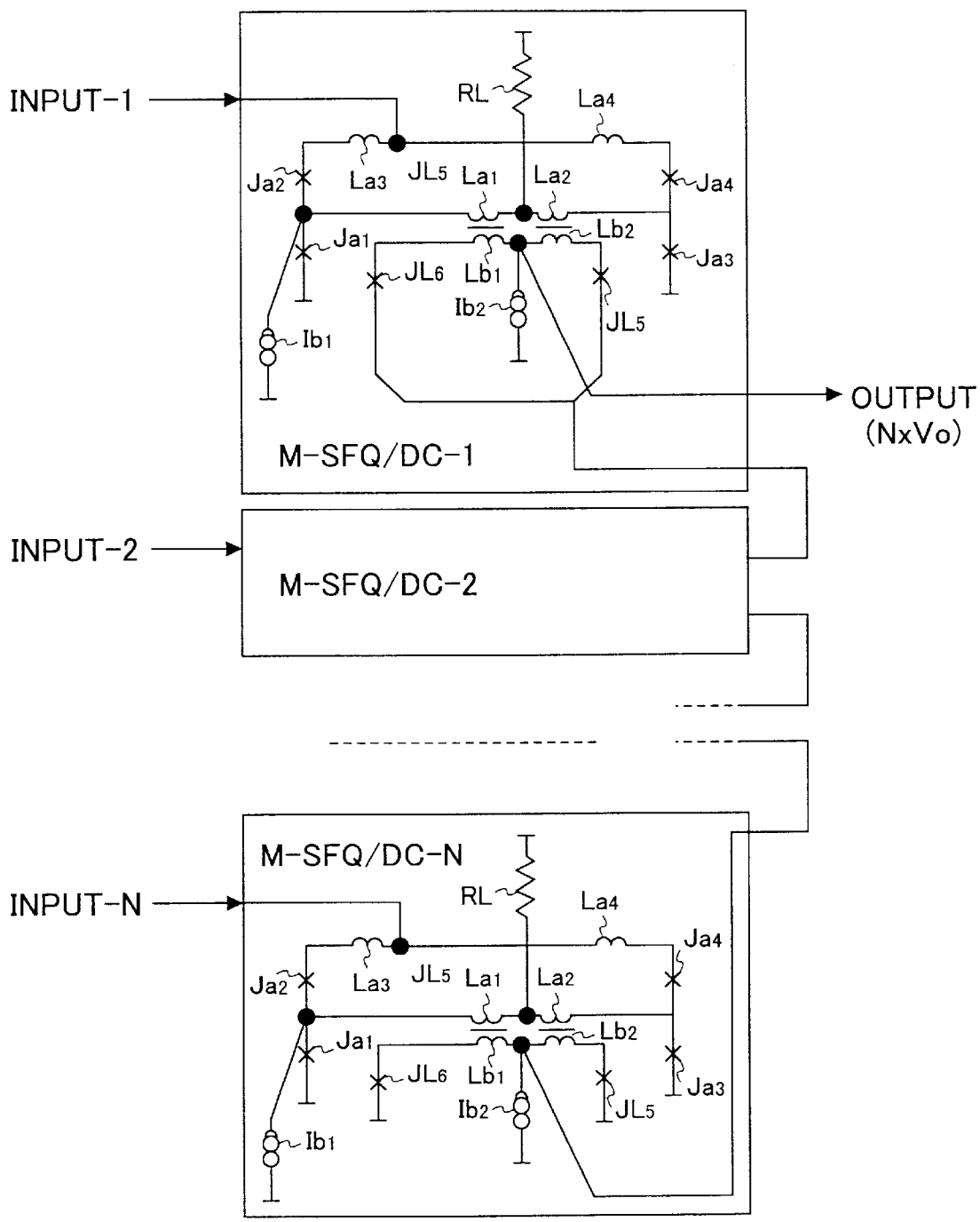
FIG. 6 is a block diagram of an RSFQ output interface circuit according to the third preferred embodiment of the present invention.

FIG. 6 shows the configuration of an RSFQ output interface circuit 40 according to the third preferred embodiment of the invention. In the output interface circuit 40, a plurality of magnetic-field coupling type RSFQ output voltage converters MSFQ/DC-1–M-SFQ/DC-N are connected together in series. Each of the RSFQ output voltage converters has the configuration that is the same as the configuration of the RSFQ logic circuit 20 of FIG. 4B. In FIG. 6, the elements that are essentially the same as corresponding elements in the previous embodiment of FIG. 4B are designated by the same reference numerals, and a description thereof will be omitted.

In the output interface circuit 40 shown in FIG. 6, the input signals INPUT-1–INPUT-N are respectively supplied to the RSFQ output voltage converters M-SFQ/DC-1–M-SFQ/DC-N, and each SQUID output circuit portion produces the corresponding output voltage signal. The in-series connection of the SQUID output circuit portions is made, and the sum of the output voltages from the respective SQUID output circuit portions is obtained from the output terminal of the RSFQ output voltage converter M-SFQ/DC-1.

Specifically, when the input signals INPUT-1–INPUT-N are identical and the output voltages produced by the respective SQUID output circuit portions are the same as the output voltage Vo, the sum of the output voltages from the respective SQUID output circuit portions of the output voltage converters M-SFQ/DC-1–M-SFQ/DC-N is equal to N times the output voltage Vo, that is, the output voltage (NxVo) is obtained from the output terminal of the of the RSFQ output voltage converter M-SFQ/DC-1. In this case, the output interface circuit 40 of FIG. 6 acts as a voltage multiplier.

In the embodiment of FIG. 6, the in-series connection of the SQUID output circuit portions of the respective RSFQ output voltage converters M-SFQ/DC-1–M-SFQ/DC-N is made. However, each SQUID output circuit portion is coupled through a magnetic field to the RSFQ logic operation portion, and does not use the direct connection thereto. Therefore, the in-series connection of the SQUID output circuit portions does not affect the operation of the RSFQ logic operation portion of each RSFQ output voltage converter.

A description will be given of the fourth preferred embodiment of the present invention.

Figure 7:
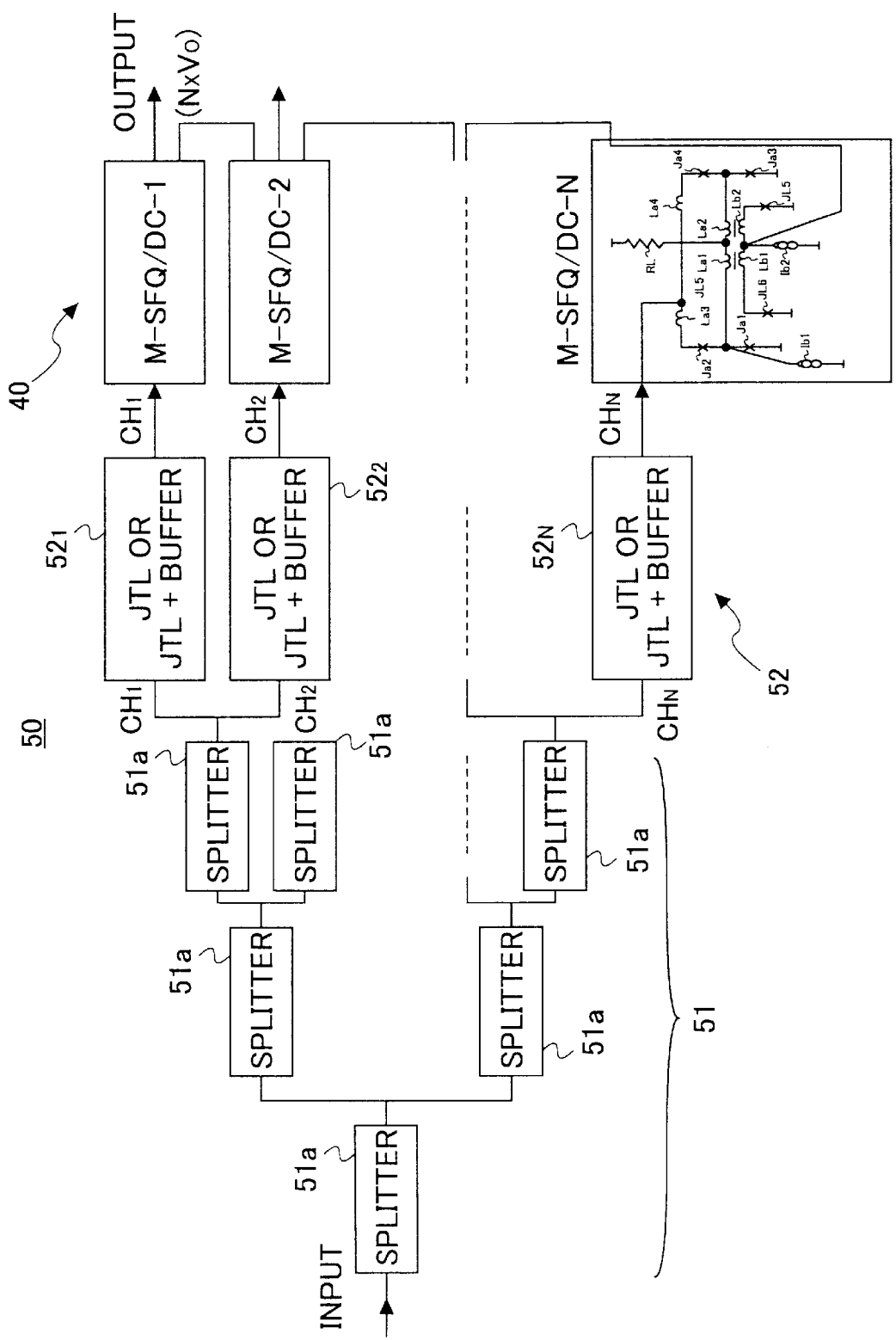
FIG. 7 is a block diagram of a voltage multiplier circuit according to the fourth preferred embodiment of the present invention.

FIG. 7 shows the configuration of an output voltage multiplier circuit 50 according to the fourth preferred embodiment of the invention. The output voltage multiplier circuit 50 is equipped with the plurality of RSFQ output voltage converters M-SFQ/DC-1–M-SFQ/DC-N included in the output interface circuit 40 of FIG. 6, and the identical input signals INPUT-1–INPUT-N are supplied to the output voltage converters. In FIG. 7, the elements that are essentially the same as corresponding elements in the previous embodiment of FIG. 6 are designated by the same reference numerals, and a description thereof will be omitted.

As shown in FIG. 7, in the output voltage multiplier circuit 50 of the present embodiment, the pulse splitter circuit 51, including the plurality of SFQ pulse splitters 51a, provides splitting of the input pulse signal, which is produced by a signal source circuit similar to the circuit 31 in the previous embodiment of FIG. 5. The pulse splitter circuit 51 produces output pulse signals CH1–CHN by the splitting of the input pulse signal. The output pulse signals CH1–CHN are passed through the plurality of Josephson junction transmission lines 52-1–52-N included in the subsequent transmission line 52. The output pulse signals CH1–CHN from the subsequent transmission line 52 are respectively supplied to the RSFQ output voltage converters M-SFQ/DC-1–M-SFQ/DC-N included in the output interface circuit 40.

In the embodiment of FIG. 7, the identical input pulse signals CH1–CHN are supplied to the output voltage converter 40, and the desired output voltage (NxVo) is obtained from the output terminal of the RSFQ output voltage converter M-SFQ/DC-1. In the present embodiment, by using the output voltage multiplier 50, it is possible to convert the output voltage of the Josephson logic circuit into the desired output voltage that can be processed by the semiconductor circuit (the IC circuit).

Figure 8:
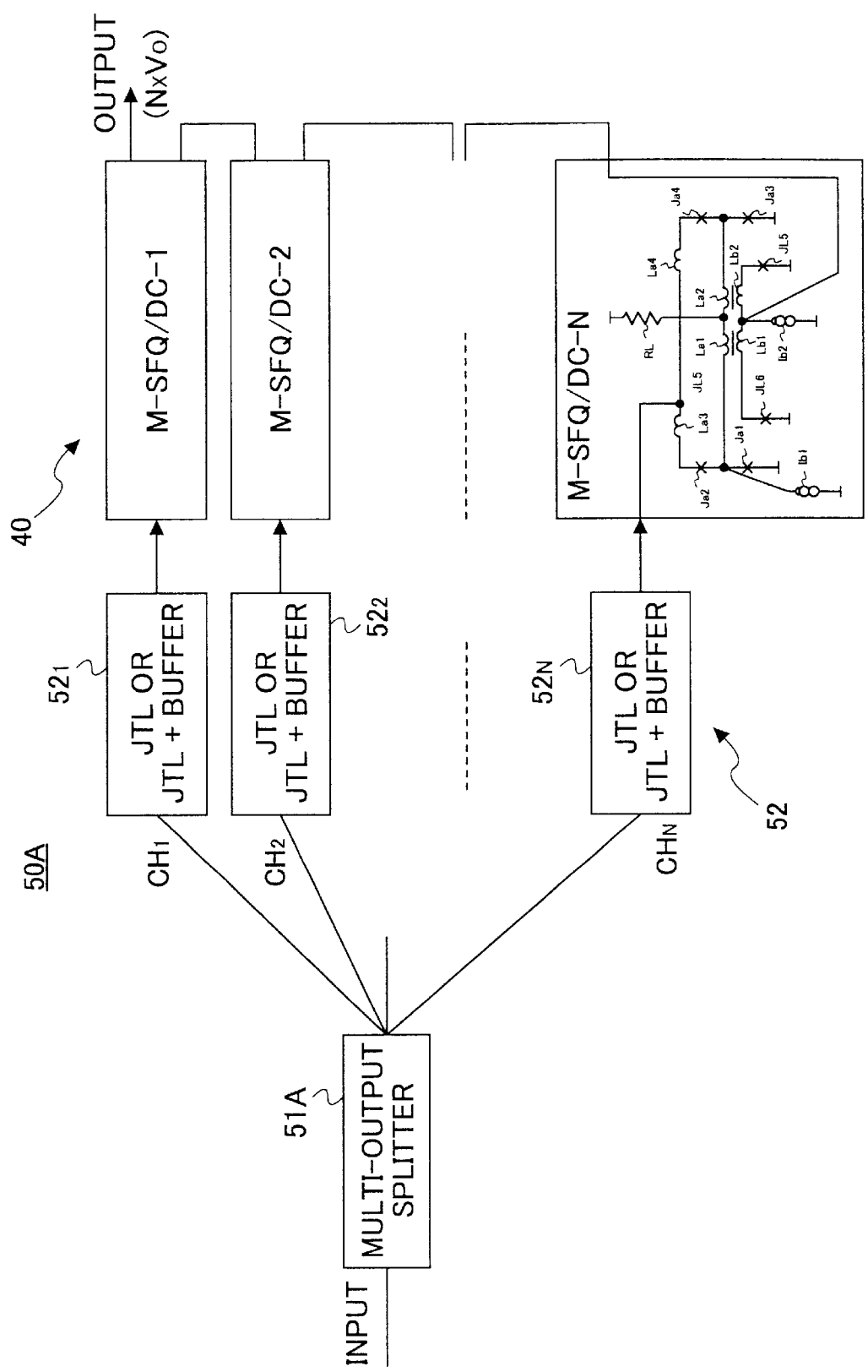
FIG. 8 is a block diagram of a variation of the voltage multiplier circuit of the fourth preferred embodiment.

FIG. 8 shows a variation of the output voltage multiplier circuit of the fourth preferred embodiment. In the present embodiment, the output voltage multiplier 50A is provided with a multi-output pulse splitter 51A which replaces the pulse splitter circuit 51 in the previous embodiment of FIG. 7.

As shown in FIG. 8, the input pulse signal is split into the plurality of output pulse signals CH1–CHN by the multi-output pulse splitter 51A, and each pulse signal is supplied to a corresponding one of the output voltage converters M-SQF/DC-1–M-SQF/DC-N. As a result, the output interface circuit 40 acts as an output voltage multiplier that produces the desired output voltage NxVo.

As the multi-output pulse splitter in the present embodiment, it is possible to use, for example, the splitter circuit described in the pre-conference draft 28a-G-30 by T. Hashimoto et al. for the 47th Applied-Physics Relation Unified Meeting, March 2000.

As described above, in the RSFQ logic circuit of the present invention, the superconducting quantum interference device SQUID is coupled to the second inductance element through the magnetic field. It is possible that the undesired influence of the SQUID on the logic operation of the RSFQ logic circuit is significantly reduced when compared with the case of the conventional direct-connection RSFQ logic circuit. Accordingly, it is possible to provide an RSFQ output voltage converter by the in-series connection of the respective SQUIDs of the plurality of the RSFQ logic circuits.

According to the present invention, the SQUID can be internally provided within the RSFQ logic circuit, and it is not necessary to externally connect the SQUIDs when forming an output voltage converter circuit as in the case of the conventional direct-connection RSFQ logic circuit. Hence, it is possible for the present invention to simplify the circuit configuration of the RSFQ logic circuit.

The present invention is not limited to the above-described embodiments, and variations and modifications may be made without departing from the scope of the present invention.

Further, the present invention is based on Japanese priority application No. 2001-143783, filed on May 14, 2001, the entire contents of which are hereby incorporated by reference.

What is claimed is:

1. A rapid single-flux-quantum RSFQ logic circuit comprising:
    a first circuit portion having a first end grounded and having a first Josephson junction and a second Josephson junction which are connected in series;
    a second circuit portion having a first end grounded and having a third Josephson junction and a fourth Josephson junction which are connected in series;
    a first inductance element connecting a second end of the first circuit portion to a second end of the second circuit portion;
    a tap provided in the first inductance element, an input current signal being supplied to the tap;
    a bias current source connected to a first connection node between the first Josephson junction and the second Josephson junction;
    a second inductance element connecting the first connection node to a second connection node between the third Josephson junction and the fourth Josephson junction; and
    a superconducting quantum interference device having a fifth Josephson junction and a sixth Josephson junction and being coupled to the second inductance element through a magnetic field.

2. The RSFQ logic circuit according to claim 1, wherein each of the first and third Josephson junctions has one end grounded, and each of the fifth and sixth Josephson junctions has a critical current value that is smaller than a smaller one of critical current values of the first and third Josephson junctions.

3. The RSFQ logic circuit according to claim 1 wherein the superconducting quantum interference device comprises a third inductance element having a first end grounded and being coupled to the second inductance element through a magnetic field, the fifth Josephson junction and the sixth Josephson junction being connected in series, and the third inductance element having a second end grounded.

4. The RSFQ logic circuit according to claim 3 wherein the superconducting quantum interference device further comprises a second bias current source connected to a third connection node between the fifth Josephson junction and the sixth Josephson junction.

5. The RSFQ logic circuit according to claim 1 wherein the superconducting quantum interference device comprises a third inductance element coupled to the second inductance element through a magnetic field, the third inductance element being connected to one end of the fifth Josephson junction, the fifth Josephson junction having the other end grounded, and the third inductance element being connected to one end of the sixth Josephson junction, the sixth Josephson junction having the other end grounded.

6. The RSFQ logic circuit according to claim 5 wherein the superconducting quantum interference device comprises a second bias current source having a tap connected to the third inductance element.

7. A rapid single-flux-quantum RSFQ output voltage converter including a plurality of RSFQ logic circuits, each RSFQ logic circuit comprising:

a first circuit portion having a first end grounded and having a first Josephson junction and a second Josephson junction which are connected in series;

a second circuit portion having a first end grounded and having a third Josephson junction and a fourth Josephson junction which are connected in series;

a first inductance element connecting a second end of the first circuit portion to a second end of the second circuit portion;

a tap provided in the first inductance element, an input current signal being supplied to the tap;

a bias current source connected to a first connection node between the first Josephson junction and the second Josephson junction;

a second inductance element connecting the first connection node to a second connection node between the third Josephson junction and the fourth Josephson junction; and a superconducting quantum interference device having a fifth Josephson junction and a sixth Josephson junction and being coupled to the second inductance element through a magnetic field, wherein the respective superconducting quantum interference devices of the plurality of RSFQ logic circuits are connected in series.

8. The RSFQ output voltage converter according to claim 7 wherein each of the plurality of RSFQ logic circuits includes a Josephson transmission line delivering an incoming single-flux-quantum SFQ pulse signal, and each of the respective Josephson transmission lines of the plurality of RSFQ logic circuits having an SFQ pulse splitter disposed thereon and providing splitting of the incoming SFQ pulse signal.

* * * * *